US006465786B1

(12) United States Patent
Rhodes

(10) Patent No.: US 6,465,786 B1
(45) Date of Patent: Oct. 15, 2002

(54) DEEP INFRARED PHOTODIODE FOR A CMOS IMAGER

(75) Inventor: Howard E. Rhodes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/388,193

(22) Filed: Sep. 1, 1999

(51) Int. Cl.[7] ................................................ G01J 1/02
(52) U.S. Cl. ................................. 250/338.4; 250/332
(58) Field of Search ........................... 250/338.4, 332, 250/349, 370.08

(56) References Cited

U.S. PATENT DOCUMENTS

| | | | | |
|---|---|---|---|---|
| 4,040,076 A | * | 8/1977 | Kosonocky et al. | 357/24 |
| 4,875,082 A | | 10/1989 | Bredthauer | 357/15 |
| 4,876,586 A | | 10/1989 | Dyck et al. | 357/30 |
| 4,940,898 A | * | 7/1990 | Mahan | 250/338.4 |
| 5,120,960 A | * | 6/1992 | Halvis | 250/338.4 |
| 5,471,515 A | | 11/1995 | Fossum et al. | 377/60 |
| 5,640,013 A | * | 6/1997 | Ishikawa et al. | 250/388.4 |
| 5,708,263 A | | 1/1998 | Wong | 250/208.1 |
| 5,757,008 A | * | 5/1998 | Akagawa et al. | 250/370.08 |
| 6,002,132 A | * | 12/1999 | Mooney et al. | 250/338.4 |

FOREIGN PATENT DOCUMENTS

JP 08186283 A * 7/1996 ......... H01L/31/108

OTHER PUBLICATIONS

Mendis et al.; "Progress in CMOS Active Pixel Image Sensors"; SPIE vol. 2172, 1994; pp. 19–29.

Nixon et al.; "256×256 CMOS Active Pixel Sensors Camera–on–a–Chip"; IEEE International Solid–State Circuits Conference, 1996; pp. 178, 179, and 440.

Kosonocky; "State–of–the–Art in Schottky–Barrier IR Image Sensors"; SPIE vol. 1685, Apr. 1992; pp. 2–19.

Kosonocky; "Review Of Infrared Image Sensors With Schottky–Barrier Detectos"; Optoelectronics–Devices and Technologies, vol. 6, No. 2, Dec. 1991; pp. 173–202.

* cited by examiner

Primary Examiner—Constantine Hannaher
Assistant Examiner—Otilia Gabor
(74) Attorney, Agent, or Firm—Dickstein Shapiro Morin & Oshinsky LLP

(57) ABSTRACT

A photodiode photosensor for use in a CMOS imager exhibiting improved infrared response. The photosensor is a diode with an infrared sensitive silicide layer, such as an iridium silicide, formed on a doped substrate. The infrared sensitive silicide is highly sensitive to infrared radiation, especially in the deep infrared spectral range. A reflective layer may be used on the infrared sensitive silicide layer so that infrared radiation entering the diode from the bottom is reflected back to the photodiode. Also disclosed are processes for forming the photodiode.

145 Claims, 9 Drawing Sheets

DEEP INFRARED PHOTODIODE FOR A CMOS IMAGER

FIELD OF THE INVENTION

The present invention relates generally to improved CMOS imagers and in particular to a CMOS imager having improved responsiveness to certain wavelengths of light.

BACKGROUND OF THE INVENTION

There are a number of different types of semiconductor-based imagers, including charge coupled devices (CCDs), photodiode arrays, charge injection devices and hybrid focal plane arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there has been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photodiode. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. Nos. 5,708,263 and 5,471,515, which are herein incorporated by reference.

To provide context for the invention, an exemplary CMOS imaging circuit is described below with reference to FIG. 1. The circuit described below, for example, includes a photodiode for accumulating photo-generated charge in an underlying portion of the substrate. It should be understood that the CMOS imager may include a photoconductor or other image to charge converting device, in lieu of a photodiode, as the initial accumulator for photo-generated charge.

Reference is now made to FIG. 1 which shows a simplified circuit for a pixel of an exemplary CMOS imager using a photodiode and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p− type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p– substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photodiode 24 thin enough to pass radiant energy or of a material which passes radiant energy is formed on the insulating layer 22. The photodiode 24 receives an applied control signal PD which causes the initial accumulation of pixel charges in n+ region 26. The n+ type region 26, adjacent one side of photodiode 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS, e.g. 0 volts. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photodiode 24 has been transferred to the floating diffusion node 30 and from there to the source follower transistor 36 and through row select transistor 38 to line 42, so that the capacitor 64 stores a voltage representing the amount of charge previously accumulated beneath the photodiode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photodiode 24. The two samplings of the diffusion node 30 charges produce respective output voltages VOUTR and VOUTS of the readout circuit 60. These voltages are then subtracted (VOUTS−VOUTR) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photodiode signal PD is nominally set to 5V and pulsed from 5V to 0V during integration. The reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD−Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PD signal is next pulsed to 0 volts, causing charge to be collected in n+ region 26. A transfer gate voltage TX, similar to the reset pulse RST, is then applied to transfer gate 28 of transistor 29 to cause the charge in n+ region 26 to transfer to floating diffusion node 30. It should be understood that for the case of a photodiode, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol.95 pages 17–25 (1995) as well as other publications. These references are incorporated herein by reference.

Pixel sensor imagers can be made sensitive to infrared light by the use of Schottky-barrier photodiodes. A Schottky-barrier photodiode consists of a thin layer of metal or metal silicide on a doped silicon base. Typically palladium and platinum are used as the metal in these photodiodes, because they respond to some radiation in the infrared range. Deep infrared imagers, however, require a greater sensitivity than is available by using these metals. The use of other metals such osmium, rhodium, rhenium, ruthenium or iridium in photodiodes has been prevented by the lack of etchants for these metals.

There is needed, therefore, a pixel photosensor for use in an imager that exhibits improved infrared response. A simple method of fabricating a pixel photosensor with improved infrared response is also needed. While this method enables the fabrication of new IR sensors using metals like osmium, iridium, this method can also be applied to the fabrication of platinum, palladium, rhodium, rhenium, or ruthenium sensors.

SUMMARY OF THE INVENTION

The present invention provides a photodiode having an infrared sensitive silicide layer such as those formed from platinum silicide, palladium silicide, osmium silicide, rhodium silicide, rhenium silicide, ruthenium silicide, iridium silicide or the like formed on a substrate of a first conductive type. The photodiode may have a reflective layer of aluminum or other infrared-opaque material formed on the infrared sensitive silicide layer. Also provided are processes for forming such photodiodes.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The term "infrared" is used to refer to electromagnetic radiation having a wavelength between 700 nm and approximately 6500 nm. The following detailed description is, therefore, not to be taken in a limiting sense, and the scope of the present invention is defined by the appended claims.

Figure 5:
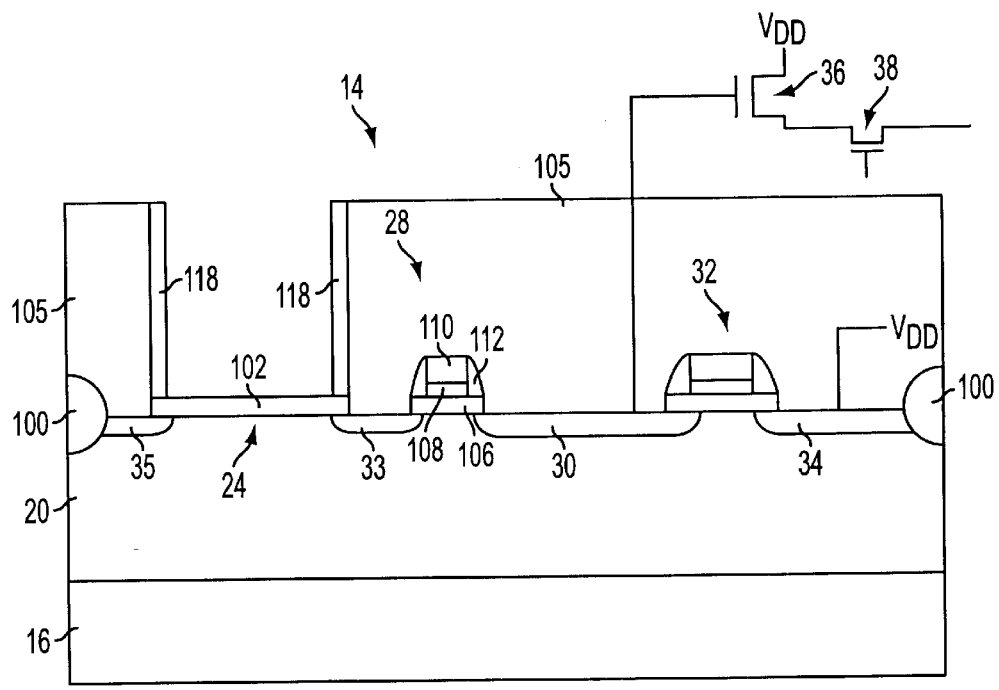
FIG. 5 is a cross-sectional view of a pixel sensor cell of a first embodiment of the present invention.
Figure 6:
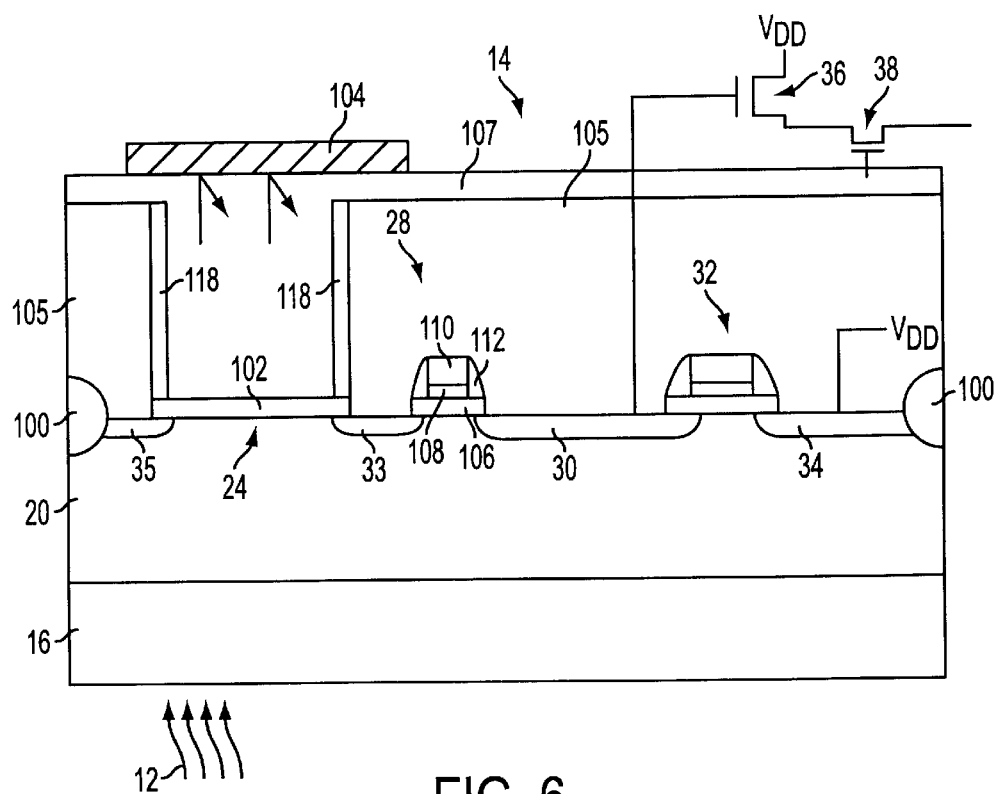
FIG. 6 is a cross-sectional view of the pixel sensor cell of FIG. 5 illustrating an optional reflecting layer therein.

The structure of the pixel cell 14 of the first embodiment is shown in more detail in FIGS. 5 and 6. The pixel cell 14 may be formed in a substrate 16 having a doped layer or well 20 of a first conductivity type, which for exemplary purposes is treated as p-type. The photodiode 24 comprises a thin layer of infrared sensitive silicide 102, such as, for example, platinum silicide, palladium silicide, osmium silicide, rhodium silicide, rhenium silicide, ruthenium silicide, iridium silicide or the like formed in the doped layer 20 next to the transfer gate 28. The pixel cell includes metal layer 118 along the insulating layer 105 after the formation of infrared sensitive silicide layer 102. It should be understood that the silicide layer may be formed by any method, such as, for example, depositing a silicide layer over insulating layer 105 or depositing a metal layer over layer 105 and annealing the metal for form a silicide layer.

As shown in FIG. 5 are two implanted regions 33 and 35 which are implanted n-type. The purpose of implant region 33 is to provide electrical contact between the infrared sensitive silicide layer 102, the n-type region 35, and the transfer gate 28. Region 35 is located between infrared sensitive silicide layer 102 and field oxide region 100. The implant 33 is a localized implant adjacent to the transfer gate. The doping of region 35 is high enough to form a good electrical contact to the infrared sensitive silicide layer 102. For simplicity, it is advantageously implanted n+. The implant region 33 is n-type and surrounds the edge of the metal silicide and serves as a barrier to reduce edge leakage. The n-type doped region 33 is advantageously doped n−.

As shown in FIG. 6, a reflecting layer 104 of infrared-opaque material such as aluminum, tungsten, tungsten silicide, copper or platinum may be formed over the infrared sensitive silicide layer 102 to reflect infrared radiation 12 entering from the bottom of the substrate 16 back into the infrared sensitive silicide layer 102. The reflecting layer is formed over opaque layer 107. The doped layer or well 20 is provided with two doped regions 30 and 34 of a second conductivity type, which for exemplary purposes is treated as n-type. The first doped region 30 is the floating diffusion region, sometimes also referred to as a floating diffusion node, and it serves as the source for the reset transistor 31. The second doped region 34 is the drain of the reset transistor 32, and is also connected to Vdd.

Figure 7:
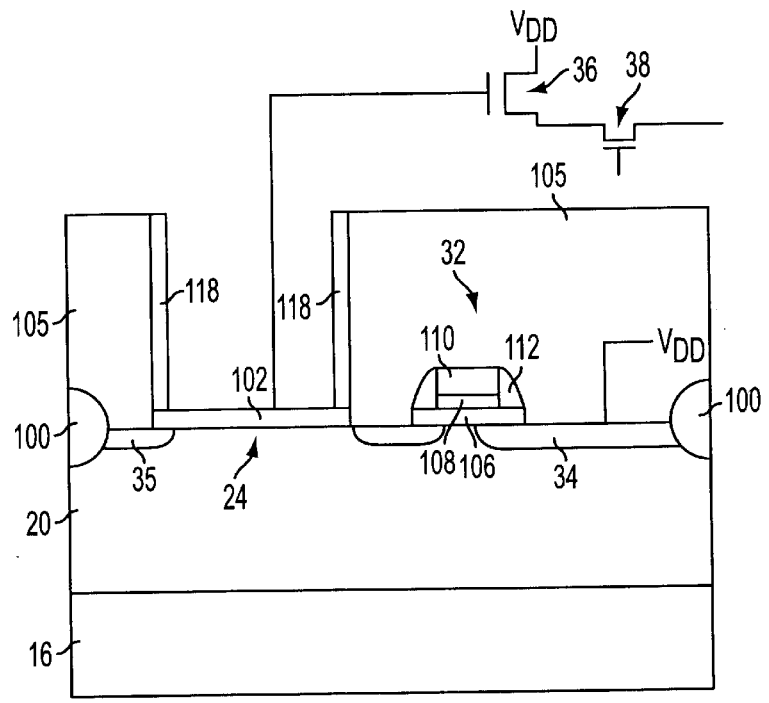
FIG. 7 is a cross-sectional view of a pixel sensor cell of a second embodiment of the present invention.
Figure 8:
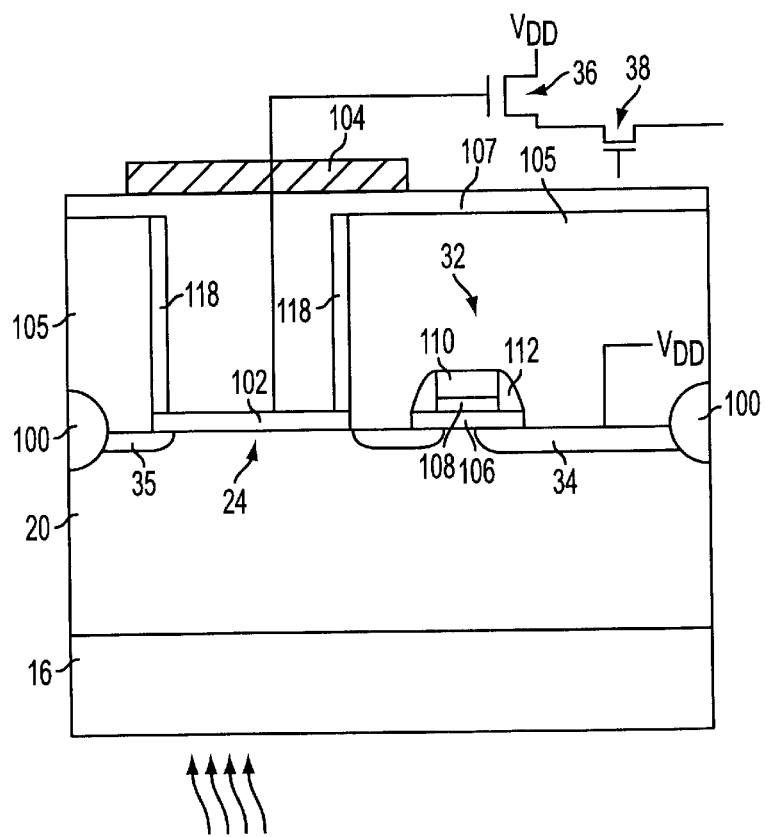
FIG. 8 is a cross-sectional view of the pixel sensor cell of FIG. 7 illustrating an optional reflecting layer therein.

The pixel cell 14 of the second embodiment is shown in more detail in FIGS. 7 and 8. These figures show the pixel cell 14 in an embodiment without a transfer gate. The pixel cell 14 may be formed in a substrate 16 having a doped layer 20 or well of a first conductivity type, which for exemplary purposes is treated as p-type. The photodiode 24 comprises a thin layer of infrared sensitive silicide layer 102 formed in the doped layer 20. As shown in FIG. 8, a reflecting layer 104 of infrared-opaque material such as aluminum or platinum, tungsten, tungsten silicide, copper may be formed over the infrared sensitive silicide layer 102 to reflect infrared radiation 12 entering from the bottom of the substrate 16 back into the infrared sensitive silicide layer 102. Adjoining the infrared sensitive silicide layer 102 is a gate stack 32 for reset transistor 31.

The gate stack 32 includes a silicon dioxide or silicon nitride insulator 106 on the doped layer 20, and conductive layer 108 of doped polysilicon, tungsten, or other suitable material over the insulating layer 106. An insulating cap layer 110 of, for example, silicon dioxide, silicon nitride, or ONO (oxide-nitride-oxide) may be formed, if desired, in which case a silicide layer or a barrier/metal layers (not shown) may be used between the conductive layer 108 and the cap 110. Insulating sidewalls 112 of, for example, silicon dioxide or silicon nitride are also formed on the sides of the gate stack 32. The doped substrate layer or well 20 is provided with a doped region 34 of a second conductivity type, which for exemplary purposes is treated as n-type. The doped region 34 is the drain of the reset transistor 31, and is also connected to Vdd.

Figure 9:
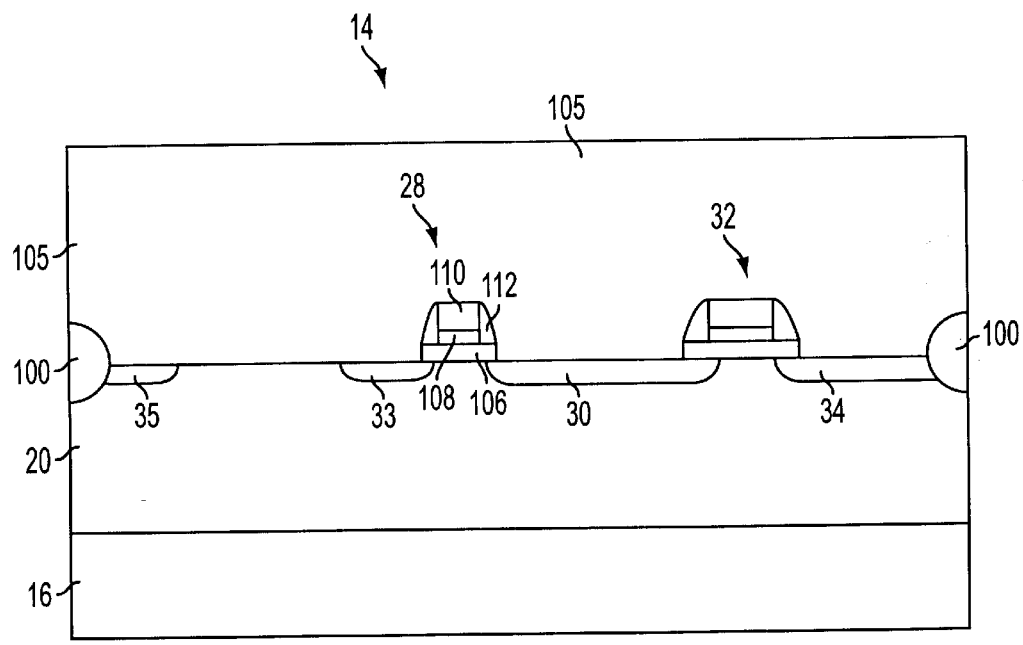
FIG. 9 is a cross-sectional view of a semiconductor wafer undergoing the process of a preferred embodiment of the invention.

The photosensor 14 is manufactured through a process described as follows, and illustrated by FIGS. 9 through 14. Referring now to FIG. 9, a substrate 16, which may be any of the types of substrate described above, is doped to form a doped substrate layer or well 20 of a first conductivity type, which for exemplary purposes will be described as p-type. Any suitable doping process, such as ion implantation, may be used. The substrate 16 is provided with devices and regions such as the transfer gate 28, the reset transistor gate 32, and doped regions 30, 33, 34 and 35 formed therein, and an insulating layer 105 which may be formed of, for example, silicon dioxide or BPSG or a combination of these or any other insulators formed on the devices.

The gate stacks include an insulating layer 106 on the doped layer 20 which may be formed of, for example, silicon dioxide, silicon nitride, a nitrided oxide or any other insulating layer material. A conductive layer 108 is formed over the insulating layer 106 and may be an insulating cap layer 110 formed of, for example, silicon dioxide, silicon nitride, ONO (oxide-nitride-oxide), ON, or NO. A silicide layer or a barrier metal/conducting metal such as, for example, TiN/W or WNx/W among others (not shown) may be used between the conductive layer 108 and the cap 110, if desired. Insulating sidewalls 112 are also formed on the sides of the gate stacks 28, 32. These sidewalls 112 may be formed of, for example, silicon dioxide or silicon nitride, ONO, ON or NO.

Figure 10:
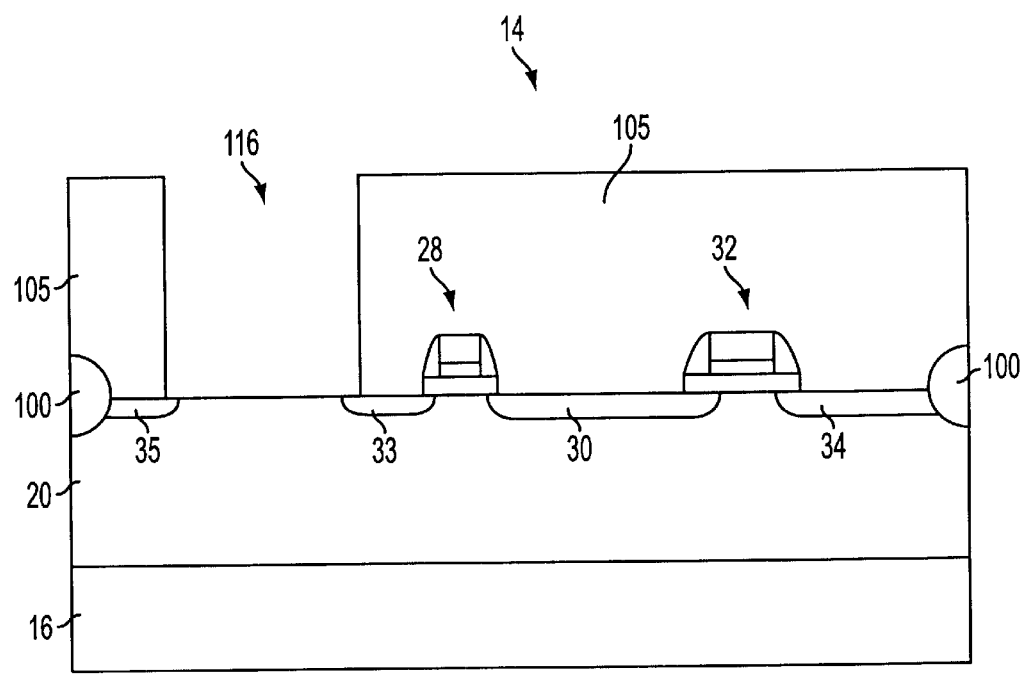
FIG. 10 shows the wafer of FIG. 9 at a processing step subsequent to that shown in FIG. 9.

As shown in FIG. 10, the first step of the process of this embodiment is to expose a portion of doped substrate layer or well 20 by forming an opening 116 in the insulating layer 105. A resist and mask (not shown) are applied, and photolithographic techniques are used to define the area to be etched-out. A directional etching process such as Reactive Ion Etching (RIE), or etching with a preferential anisotropic etchant, is used to etch into the insulating layer 105 until the doped layer 20 is exposed, and an opening 116 has been formed in the insulating layer 105. The resist and mask are removed, leaving a structure that appears as shown in FIG. 10.

Figure 11:
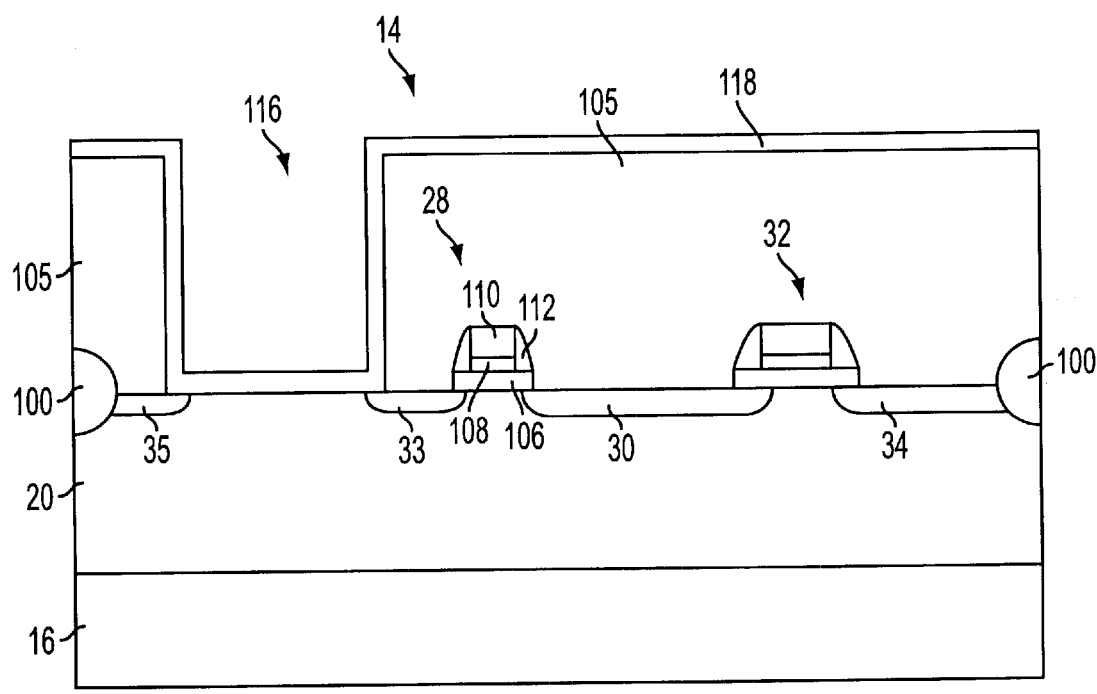
FIG. 11 shows the wafer of FIG. 9 at a processing step subsequent to that shown in FIG. 10.
Figure 12:
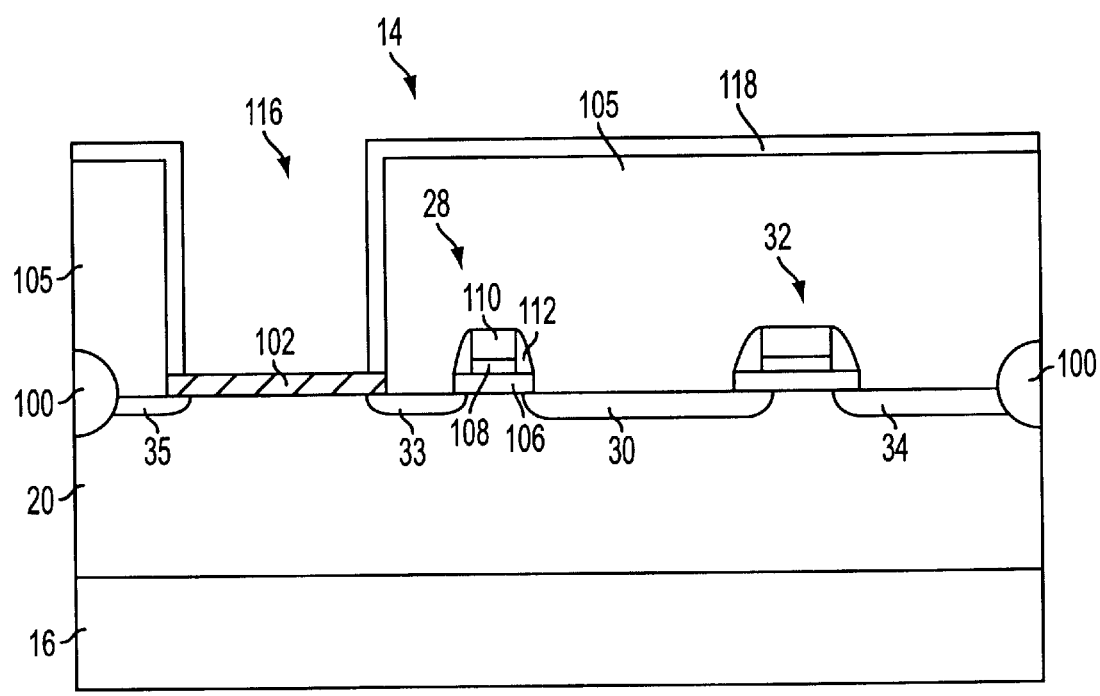
FIG. 12 shows the wafer of FIG. 9 at a processing step subsequent to that shown in FIG. 11.

FIG. 11 depicts the next step of the process, in which metal layer 118 is deposited on the insulating layer 105 and in the trench 116. The metal layer 118 may be formed of any metal, such as, for example, platinum, palladium, osmium, rhodium, rhenium, ruthenium, iridium or the like. The metal layer 118 may be deposited by suitable means such as chemical vapor deposition, evaporation, or sputtering. Referring now to FIG. 12, an infrared sensitive silicide layer 102 is formed by annealing the metal layer 118 at a temperature within the approximate range of 300 to 800 degrees Celsius. The resultant structure is shown in FIG. 12.

Figure 13:
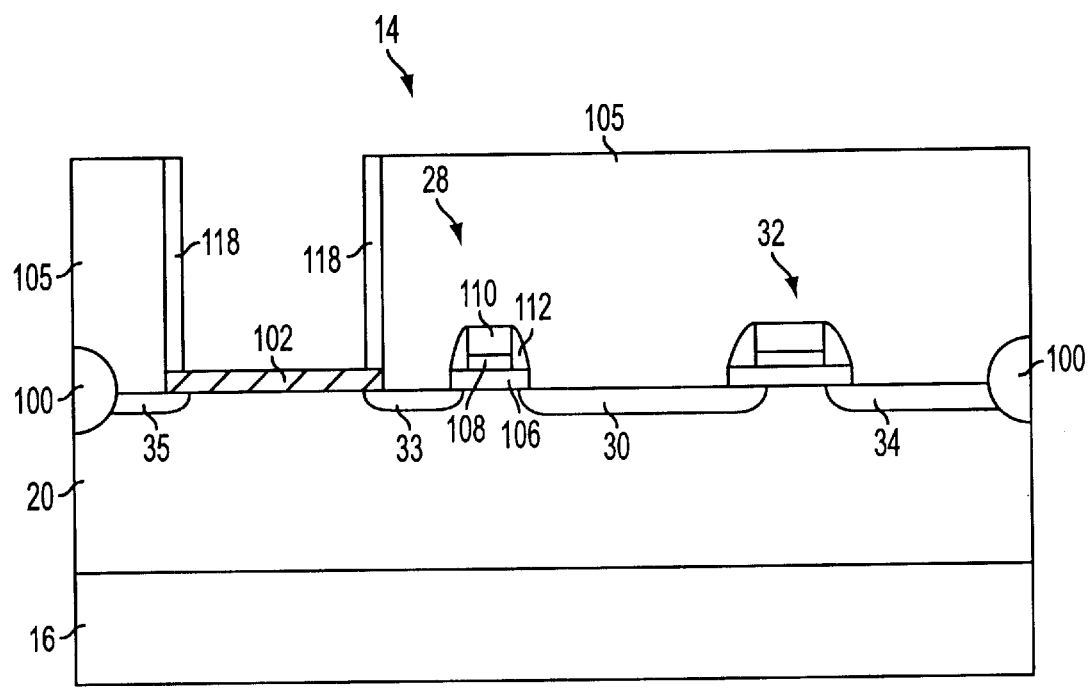
FIG. 13 shows the wafer of FIG. 9 at a processing step subsequent to that shown in FIG. 12.

Referring now to FIG. 13, metal layer 118 on the horizontal surfaces of the insulating layer 105 is now removed by suitable means, such as chemical-mechanical polishing. Advantageously, this is accomplished by first depositing a sacrificial layer such as photo resist or spin-on-glass. Then the wafer is chemical-mechanical polished to remove the infrared sensitive metal off the surface. Finally the sacrificial layer is removed from the opening 116. The photosensor 14 at this stage is shown in FIG. 13. The metal layer 118 on the sidewall of the opening 116 may or may not be removed. If in the case that the deposited metal film is platinum, a wet chemical etchant such as aqua region may be used to remove the sidewall platinum without removing the platinum silicide at the bottom of the opening 116. But this sidewall metal film does not need to be removed.

Figure 1:
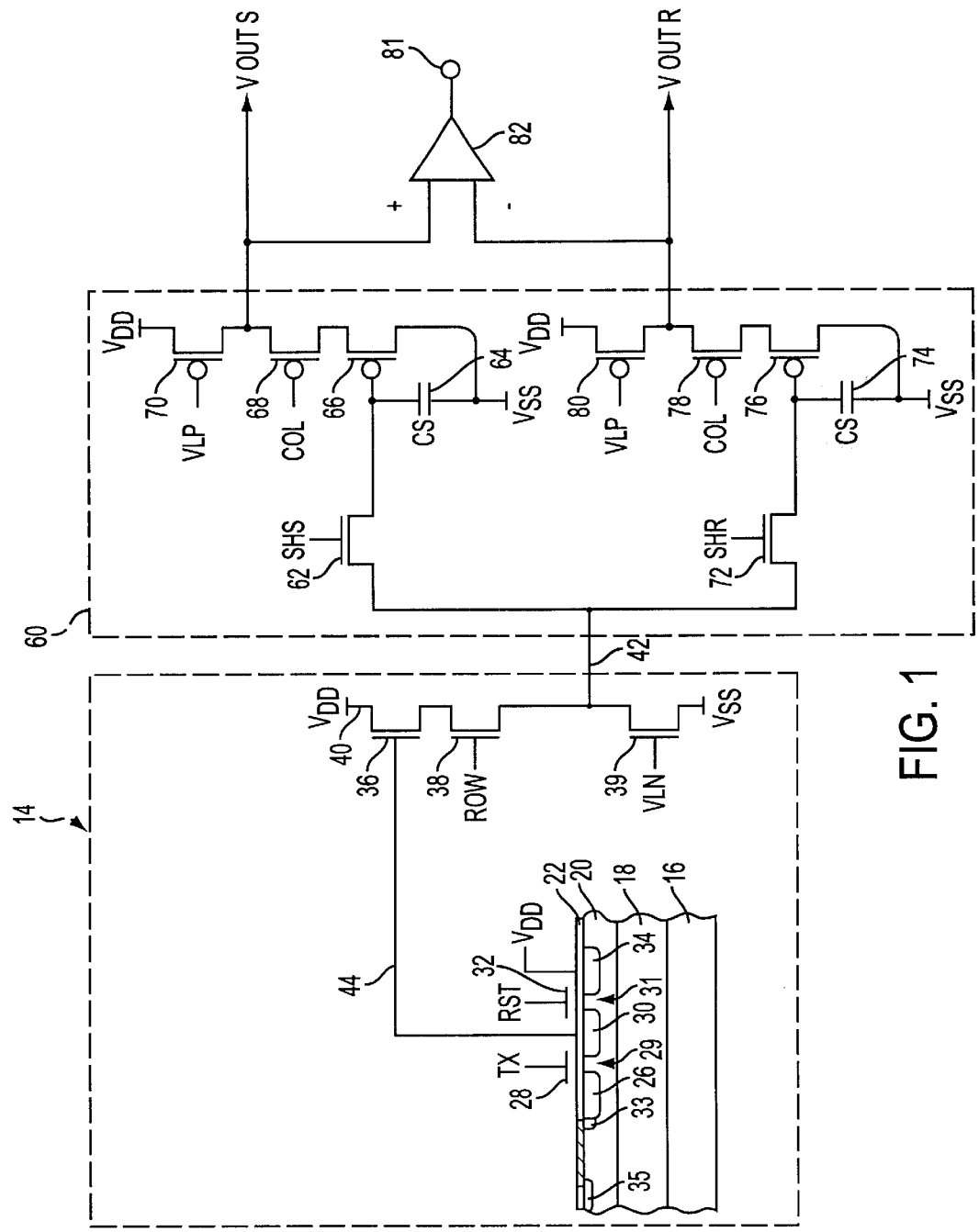
FIG. 1 is a representative circuit of a CMOS imager.
Figure 2:
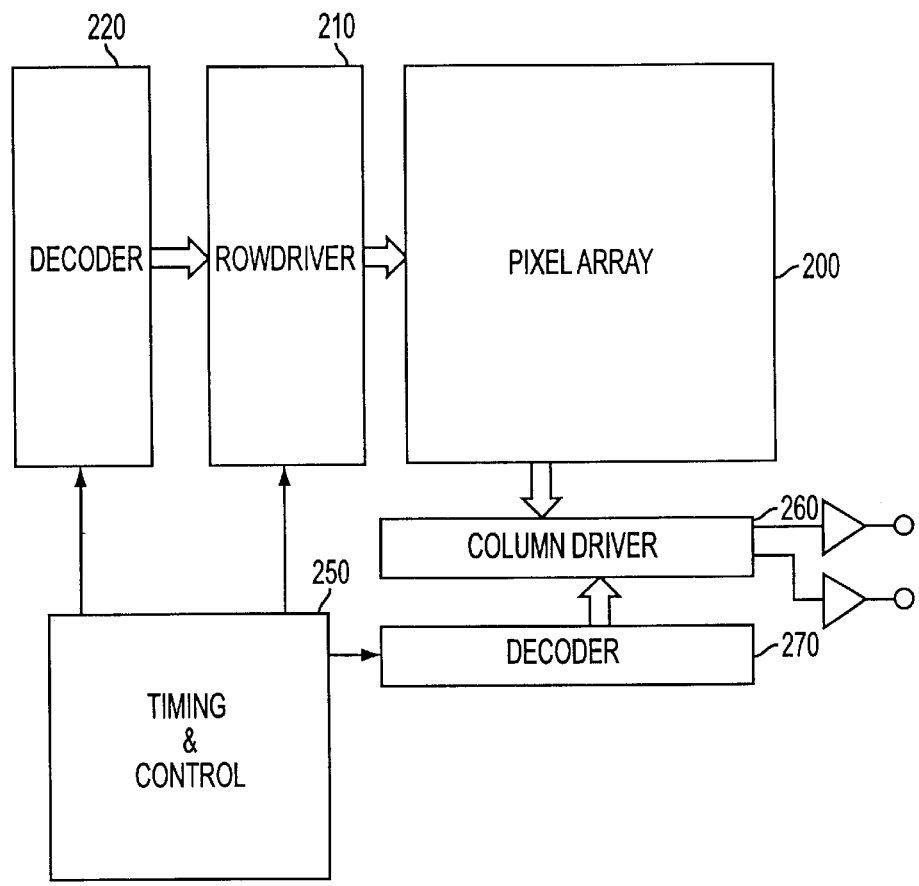
FIG. 2 is a block diagram of a CMOS pixel sensor chip.
Figure 3:
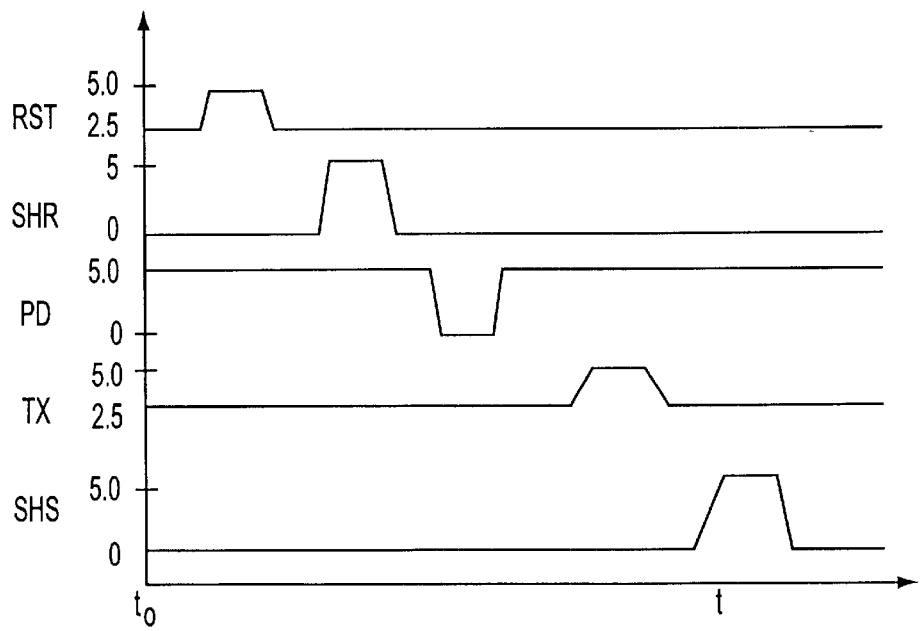
FIG. 3 is a representative timing diagram for the CMOS imager.
Figure 4:
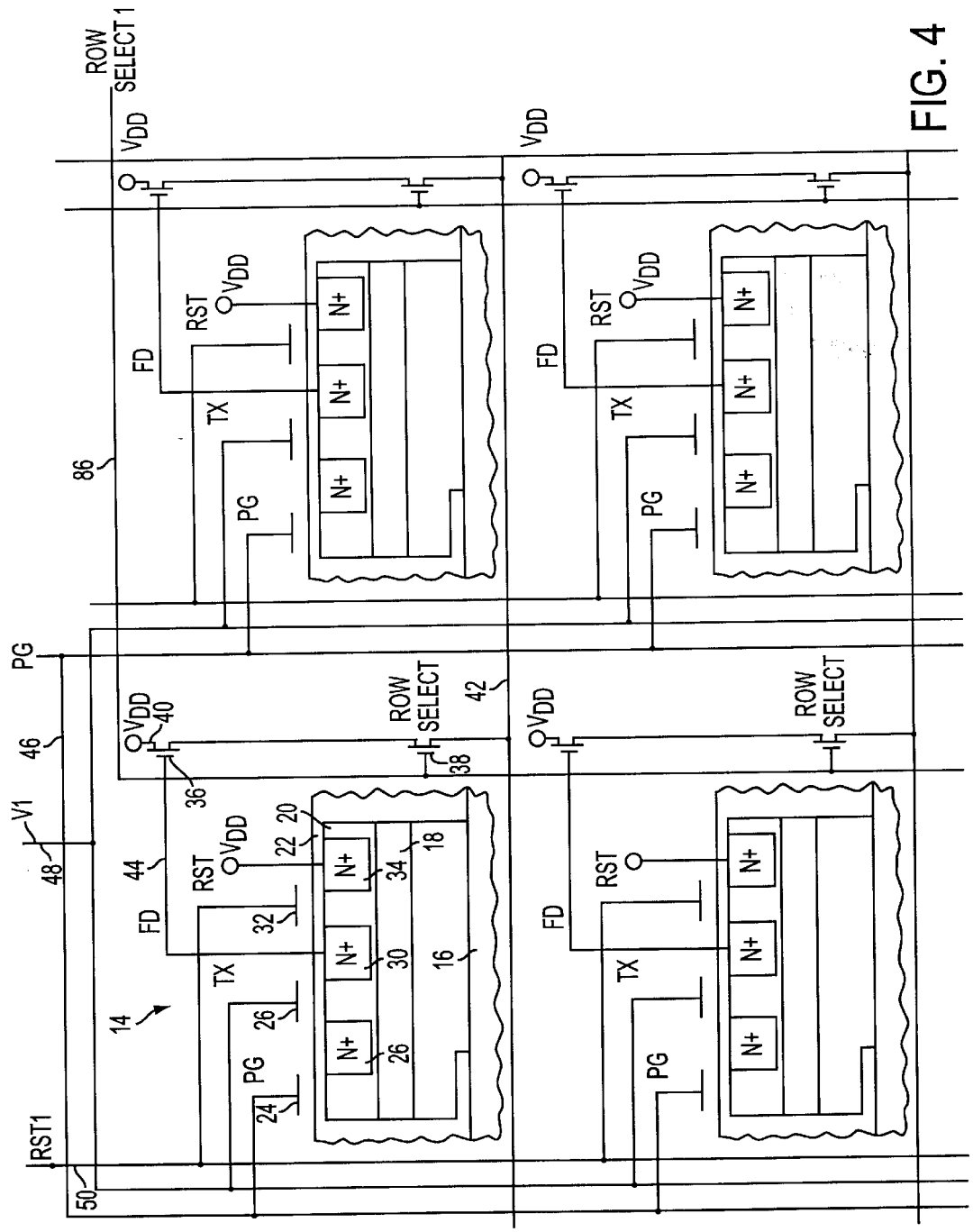
FIG. 4 is a representative pixel layout showing a 2×2 pixel layout.
Figure 14:
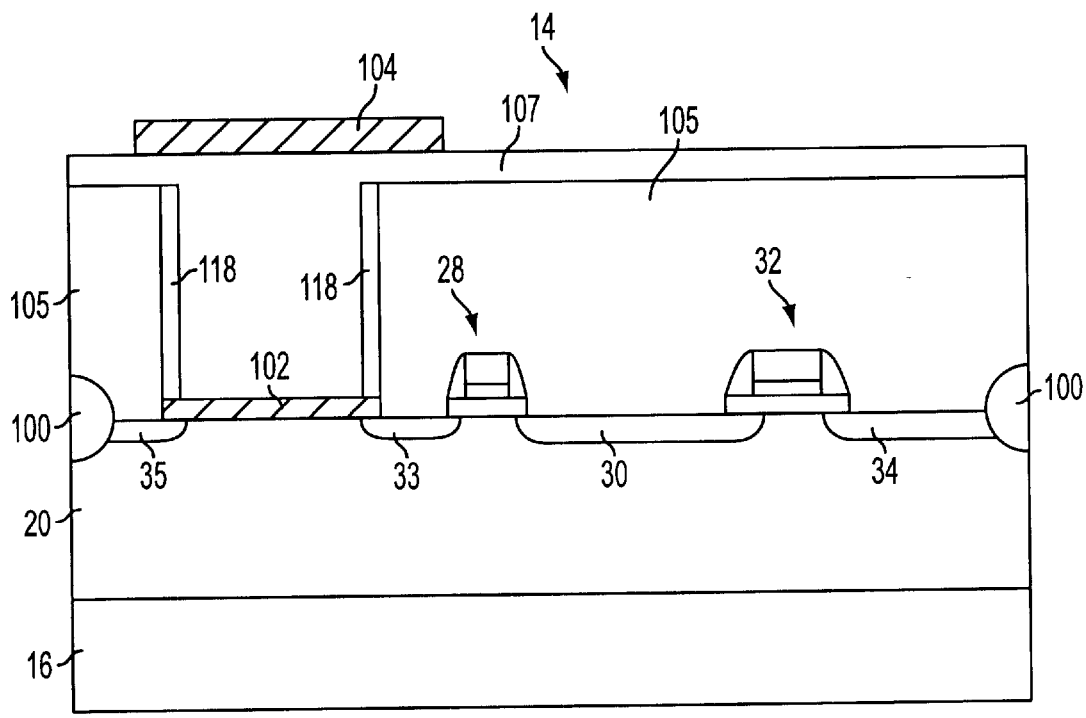
FIG. 14 shows the wafer of FIG. 9 at a processing step subsequent to that shown in FIG. 13.

For the pixel cell 14 of the first embodiment, the photosensor 14 is essentially complete at this stage, and conventional processing methods may then be used to form contacts and wiring to connect gate lines and other connections in the pixel cell 14. For example, the entire surface may then be covered with a passivation layer 107 of, e.g., silicon dioxide, BSG, PSG or BPSG, which is CMP planarized and etched to provide contact holes, which are then metallized to provide contacts to the photodiode, reset gate and transfer gate. Conventional multiple layers of conductors and insulation may also be used to interconnect the structures in the manner shown in FIG. 1. Optionally, a reflective layer 104 of infrared-opaque material such as aluminum, platinum, tungsten, tungsten silicide, or copper may be formed on the infrared sensitive silicide layer 102, as shown in FIG. 14. The reflective layer 104 may be formed by suitable means such as chemical vapor deposition or sputtering.

Figure 15:
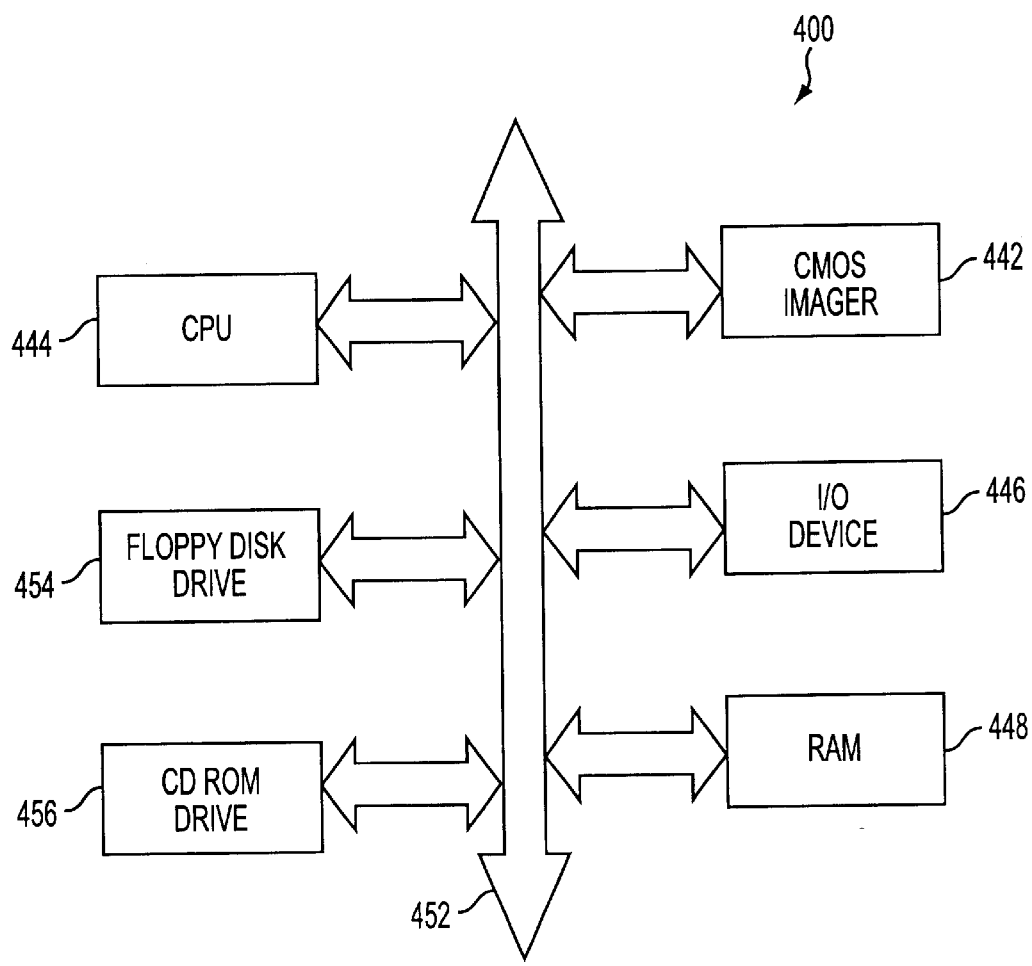
FIG. 15 is an illustration of a computer system having a CMOS imager according to the present invention.

A typical processor based system which includes a CMOS imager device according to the present invention is illustrated generally at 400 in FIG. 15. A processor based system is exemplary of a system having digital circuits which could include CMOS imager devices. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor system, such as a computer system, for example generally comprises a central processing unit (CPU) 444, e.g., a microprocessor, that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes pixels containing Schottky-barrier photodiodes with infrared sensitive silicide layers, as previously described with respect to FIGS. 5 through 14. The CMOS imager 442 may be combined with a processor, such as a CPU, digital signal processor or microprocessor, with or without memory storage in a single integrated circuit or may be on a different chip than the processor.

As can be seen by the embodiments described herein, the present invention encompasses a Schottky-barrier photodiode formed of an iridium silicide layer on a doped substrate. The iridium silicide is highly sensitive to infrared radiation, especially deep infrared radiation. The process embodiments described herein enable formation of an iridium-containing photodiode without the need to etch iridium.

It should again be noted that although the invention has been described with specific reference to CMOS imaging circuits having a photodiode and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A photosensor for use in an imaging device, said photosensor comprising:
    a doped layer formed in a substrate;
    an insulating layer formed over the doped layer;
    a trench formed in said insulating layer over at least a portion of said doped layer;
    an infrared sensitive silicide layer formed of a conductive material in said trench on at least a portion of the doped layer, said infrared sensitive silicide layer permitting image radiation to pass therethrough; and
    a conductive layer formed on the sidewalls of said trench, said conductive layer being formed of the same conductive material used to form said infrared sensitive silicide layer.

2. The photosensor according to claim 1, further comprising a reflecting layer formed on the infrared sensitive silicide layer.

3. The photosensor according to claim 2, wherein the reflecting layer is selected from the group consisting of aluminum, tungsten, tungsten silicide, copper and platinum.

4. The photosensor according to claim 3, wherein the reflecting layer is platinum.

5. The photosensor according to claim 3, wherein the reflecting layer is aluminum.

6. The photosensor according to claim 1, wherein said infrared sensitive silicide layer is formed of iridium silicide.

7. The photosensor according to claim 1, wherein said infrared sensitive silicide layer is formed of platinum silicide.

8. The photosensor according to claim 1, wherein said infrared sensitive silicide layer is formed of palladium silicide.

9. The photosensor according to claim 1, wherein said infrared sensitive silicide layer is formed of osmium silicide.

10. The photosensor according to claim 1, wherein said infrared sensitive silicide layer is formed of rhodium silicide.

11. The photosensor according to claim 1, wherein said infrared sensitive silicide layer is formed of rhenium silicide.

12. The photosensor according to claim 1, wherein said infrared sensitive silicide layer is formed of ruthenium silicide.

13. The photosensor according to claim 1, wherein the doped layer is doped p-type.

14. The photosensor according to claim 1, wherein the conductive layer is removed from the upper surface of the insulating layer by chemical-mechanical-polishing.

15. A photosensor for use in an imaging device, said photosensor comprising:
    a doped layer formed in a substrate;
    an insulating layer formed over said doped layer;

a trench formed in said insulating layer over at least a portion of said doped layer;

an infrared sensitive silicide layer formed of a conductive material in said trench on at least a portion of the doped layer;

a conductive layer formed on the sidewalls of said trench, said conductive layer being formed of the same conductive material used to form said infrared sensitive silicide layer;

a doped region formed in said substrate spaced apart from said infrared sensitive silicide layer for receiving image charge transferred from said doped layer; and a transfer gate formed in said substrate for gating image charge accumulated in said doped layer to said doped region.

16. The photosensor according to claim 15, wherein said infrared sensitive silicide layer is formed of iridium silicide.

17. The photosensor according to claim 15, wherein said infrared sensitive silicide layer is formed of platinum silicide.

18. The photosensor according to claim 15, wherein said infrared sensitive silicide layer is formed of palladium silicide.

19. The photosensor according to claim 15, wherein said infrared sensitive silicide layer is formed of osmium silicide.

20. The photosensor according to claim 15, wherein said infrared sensitive silicide layer is formed of rhodium silicide.

21. The photosensor according to claim 15, wherein said infrared sensitive silicide layer is formed of rhenium silicide.

22. The photosensor according to claim 15, wherein said infrared sensitive silicide layer is formed of ruthenium silicide.

23. The photosensor according to claim 15, wherein the doped layer is doped p-type.

24. The photosensor according to claim 15, wherein the conductive layer is removed from the upper surface of the insulating layer by chemical-mechanical-polishing.

25. The photosensor according to claim 15, wherein the doped region is doped to a second conductivity type.

26. The photosensor according to claim 25, wherein the second conductivity type is n-type.

27. The photosensor according to claim 15 further comprising a reflecting layer formed over the infrared sensitive silicide layer.

28. The photosensor according to claim 27, wherein the reflecting layer is selected from the group consisting of aluminum, tungsten, tungsten silicide, copper and platinum.

29. The photosensor according to claim 28, wherein the reflecting layer is platinum.

30. The photosensor according to claim 28, wherein the reflecting layer is aluminum.

31. A pixel sensor cell for use with an imaging device, said cell comprising:

a doped layer formed in a substrate;

an insulating layer formed over said doped layer;

a trench formed in said insulating layer over at least a portion of said doped layer;

an infrared sensitive silicide layer formed of a conductive material in said trench on at least a portion of the doped layer;

a conductive layer formed on the sidewalls of said trench, said conductive layer being formed of the same conductive material used to form said infrared sensitive silicide layer;

a doped region formed in said substrate spaced apart from said infrared sensitive silicide layer for receiving image charge transferred from said doped layer;

a transfer gate formed in said substrate for gating image charge accumulated in said doped layer to said doped region;

a reset transistor for periodically resetting said doped layer to a predetermined potential; and an output transistor having a gate electrically connected to said doped layer for providing a signal representing image charge stored in said doped layer.

32. The pixel sensor according to claim 31, wherein said infrared sensitive silicide layer is formed of iridium silicide.

33. The pixel sensor according to claim 31, wherein said infrared sensitive silicide layer is formed of platinum silicide.

34. The pixel sensor according to claim 31, wherein said infrared sensitive silicide layer is formed of palladium silicide.

35. The pixel sensor according to claim 31, wherein said infrared sensitive silicide layer is formed of osmium silicide.

36. The pixel sensor according to claim 31, wherein said infrared sensitive silicide layer is formed of rhodium silicide.

37. The pixel sensor according to claim 31, wherein said infrared sensitive silicide layer is formed of rhenium silicide.

38. The pixel sensor according to claim 31, wherein said infrared sensitive silicide layer is formed of ruthenium silicide.

39. The pixel sensor according to claim 31, wherein the doped layer is doped p-type.

40. The pixel sensor according to claim 31, wherein the conductive layer is removed from the upper surface of the insulating layer by chemical-mechanical-polishing.

41. The pixel sensor according to claim 31, wherein the doped region is doped to a second conductivity type.

42. The pixel sensor according to claim 41, wherein the second conductivity type is n-type.

43. The pixel sensor according to claim 31 further comprising a reflecting layer formed over the infrared sensitive silicide layer.

44. The pixel sensor according to claim 43, wherein the reflecting layer is selected from the group consisting of aluminum, tungsten, tungsten silicide, copper and platinum.

45. The pixel sensor according to claim 44, wherein the reflecting layer is platinum.

46. The pixel sensor according to claim 44, wherein the reflecting layer is aluminum.

47. A CMOS imager comprising:

a doped layer formed in a substrate;

an insulating layer formed over said doped layer;

a trench formed in said insulating layer over at least a portion of said doped layer;

an array of pixel sensor cells formed in said doped layer, wherein each pixel sensor cell has a photodiode, said photodiode comprising an infrared sensitive silicide layer formed of a conductive material in said trench on at least a portion of the doped layer, and a conductive layer formed on the sidewalls of said trench, said conductive layer being formed of the same conductive material used to form said infrared sensitive silicide layer, each of said cells having a respective doped region for receiving and outputting image charge received from said doped layer; and signal processing circuitry formed in said substrate and electrically connected to the array for receiving and processing signals representing image charge outputted by the array.

48. The CMOS imager according to claim 47, wherein the pixel sensor cells further comprise a reflecting layer on the infrared sensitive silicide layer.

49. The CMOS imager according to claim 48, wherein the reflecting layer is selected from the group consisting of aluminum, tungsten, tungsten silicide, copper and platinum.

50. The CMOS imager according to claim 49, wherein the reflecting layer is platinum.

51. The CMOS imager according to claim 49, wherein the reflecting layer is aluminum.

52. The CMOS imager according to claim 47, wherein said infrared sensitive silicide layer is formed of iridium silicide.

53. The CMOS imager according to claim 47, wherein said infrared sensitive silicide layer is formed of platinum silicide.

54. The CMOS imager according to claim 47, wherein said infrared sensitive silicide layer is formed of palladium silicide.

55. The CMOS imager according to claim 47, wherein said infrared sensitive silicide layer is formed of osmium silicide.

56. The CMOS imager according to claim 47, wherein said infrared sensitive silicide layer is formed of rhodium silicide.

57. The CMOS imager according to claim 47, wherein said infrared sensitive silicide layer is formed of rhenium silicide.

58. The CMOS imager according to claim 47, wherein said infrared sensitive silicide layer is formed of ruthenium silicide.

59. The CMOS imager according to claim 47, wherein the doped layer is doped p-type.

60. The CMOS imager according to claim 47, wherein the conductive layer is removed from the upper surface of the insulating layer by chemical-mechanical-polishing.

61. The CMOS imager according to claim 47, wherein the doped region is doped to a second conductivity type.

62. The CMOS imager according to claim 61, wherein the second conductivity type is n-type.

63. An integrated circuit imager comprising:
an array of pixel sensor cells formed in a substrate, wherein each pixel sensor cell has a photodiode, said photodiode comprising an iridium silicide layer on said substrate and a conductive iridium layer formed on the sidewalls of a trench formed in an insulating layer over said substrate;
signal processing circuitry formed in said substrate and electrically connected to the array for receiving and processing signals representing an image output by the array and for providing output data representing said image; and
a processor for receiving and processing data representing said image.

64. An integrated circuit imager comprising:
a CMOS imager, said CMOS imager comprising an array of pixel sensor cells formed in a doped layer on a substrate, wherein each pixel sensor cell has a photodiode, said photodiode comprising an infrared sensitive silicide layer formed of a conductive material in a trench formed in an insulating layer formed on said doped layer, said trench being formed over at least a portion of said doped layer; and
a conductive layer formed on the sidewalls of said trench, said conductive layer being formed of the same conductive material used to form said infrared sensitive silicide layer, each of said cells having a respective doped region for receiving and outputting image charge received from said doped layer, and signal processing circuitry formed in said substrate and electrically connected to the array for receiving and processing signals representing an image output by the array and for providing output data representing said image; and
a processor for receiving and processing data representing said image.

65. The circuit according to claim 64, wherein said infrared sensitive silicide layer is formed of iridium silicide.

66. The circuit according to claim 64, wherein said infrared sensitive silicide layer is formed of platinum silicide.

67. The circuit according to claim 64, wherein said infrared sensitive silicide layer is formed of palladium silicide.

68. The circuit according to claim 64, wherein said infrared sensitive silicide layer is formed of osmium silicide.

69. The circuit according to claim 64, wherein said infrared sensitive silicide layer is formed of rhodium silicide.

70. The circuit according to claim 64, wherein said infrared sensitive silicide layer is formed of rhenium silicide.

71. The circuit according to claim 64, wherein said infrared sensitive silicide layer is formed of ruthenium silicide.

72. A method of forming a photodiode for use in an imaging device, said method comprising the steps of:
forming a doped layer in a substrate;
forming an insulating layer over said doped layer;
forming an opening in said insulating layer to expose at least a portion of said doped layer;
forming a metal layer on said portion of said doped layer and also on sidewalls of said opening;
forming an infrared sensitive silicide layer from said metal layer; and
removing the unreacted metal by chemical mechanical polishing.

73. The method according to claim 72, wherein the doped layer forming step further comprises ion implantation of at least one dopant into the substrate.

74. The method according to claim 72, wherein the doped layer is doped to a first conductivity type.

75. The method according to claim 74, wherein the first conductivity type is p-type.

76. The method according to claim 74, wherein the first conductivity type is n-type.

77. The method according to claim 72, wherein the step of forming the metal layer comprises forming the metal layer using chemical vapor deposition.

78. The method according to claim 72, wherein the step of forming the metal layer comprises forming the metal layer using evaporation.

79. The method according to claim 72, wherein the step of forming the metal layer comprises forming the metal layer using sputtering.

80. The method according to claim 72, wherein the step of forming the infrared sensitive silicide layer comprises annealing the metal layer.

81. The method according to claim 80, wherein the annealing is carried out at a temperature within the range of approximately 300 to 800 degrees Celsius.

82. The method according to claim 72, wherein said metal layer is iridium.

83. The method according to claim 72, wherein said metal layer is platinum.

84. The method according to claim 72, wherein said metal layer is palladium.

85. The method according to claim 72, wherein said metal layer is osmium.

86. The method according to claim 72, wherein said metal layer is rhodium.

87. The method according to claim 72, wherein said metal layer is rhenium.

88. The method according to claim 72, wherein said metal layer is ruthenium.

89. The method according to claim 72, further comprising forming a reflective layer on the infrared sensitive silicide layer.

90. The method according to claim 89, wherein said reflecting layer is selected from the group consisting of aluminum, tungsten, tungsten silicide, copper and platinum.

91. A method of forming a photodiode for use in an imaging device, said method comprising the steps of:
   forming a doped layer in a substrate having devices formed thereon and a protective layer over the devices;
   removing at least a portion of the protective layer to expose a portion of the doped layer;
   forming a metal layer on the exposed portion of the doped layer and also on sidewalls of a trench formed in said protective layer;
   forming an infrared sensitive silicide layer from said metal layer; and
   removing the unreacted metal by chemical-mechanical-polishing.

92. The method according to claim 91, wherein the doped layer is doped to a first conductivity type.

93. The method according to claim 92, wherein the doped layer forming step further comprises ion implantation of at least one dopant into the substrate.

94. The method according to claim 91, wherein the protective layer is a layer of silicon dioxide.

95. The method according to claim 91, wherein the step of removing the protective layer further comprises wet etching.

96. The method according to claim 91, wherein the step of removing the protective layer further comprises dry etching.

97. The method according to claim 91, wherein the doped layer is doped to a first conductivity type.

98. The method according to claim 97, wherein the first conductivity type is p-type.

99. The method according to claim 91, wherein the step of forming the metal layer comprises forming the metal layer using chemical vapor deposition.

100. The method according to claim 91, wherein the step of forming the metal layer comprises forming the metal layer using evaporation.

101. The method according to claim 91, wherein the step of forming the metal layer comprises forming the metal layer using sputtering.

102. The method according to claim 91, wherein the step of forming the infrared sensitive silicide layer comprises annealing the metal layer.

103. The method according to claim 102, wherein the annealing is carried out at a temperature within the range of approximately 300 to 800 degrees Celsius.

104. The method according to claim 91, wherein said metal layer is iridium.

105. The method according to claim 91, wherein said metal layer is platinum.

106. The method according to claim 91, wherein said metal layer is palladium.

107. The method according to claim 91, wherein said metal layer is osmium.

108. The method according to claim 91, wherein said metal layer is rhodium.

109. The method according to claim 91, wherein said metal layer is rhenium.

110. The method according to claim 91, wherein said metal layer is ruthenium.

111. The method according to claim 91, further comprising forming a reflecting layer over the infrared sensitive silicide layer.

112. The method according to claim 111, wherein said reflecting layer is selected from the group consisting of aluminum, tungsten, tungsten silicide, copper and platinum.

113. A method of forming a photodiode for use in an imaging device, said method comprising the steps of:
   forming a doped layer in a substrate having devices formed thereon and a protective layer over the devices;
   forming a trench in the protective layer, wherein the trench bottom exposes said doped layer;
   forming a blocking layer on the sides of the trench;
   forming a metal layer on the bottom and sides of the trench;
   forming an infrared sensitive silicide layer from said metal layer; and
   removing the unreacted metal by chemical-mechanical-polishing.

114. The method according to claim 113, wherein the doped layer is doped to a first conductivity type.

115. The method according to claim 113, wherein the step of removing the protective layer further comprises dry etching.

116. The method according to claim 113, wherein the step of removing the protective layer further comprises wet etching.

117. The method according to claim 113, wherein the photodiode is a p-n junction photodiode.

118. The method according to claim 113, wherein the step of forming the infrared sensitive silicide layer comprises annealing the metal layer at a temperature within the range of approximately 300 to 600 degrees Celsius.

119. The method according to claim 113, further comprising forming a reflective layer on the infrared sensitive silicide layer.

120. The method according to claim 113, wherein the blocking layer is a silicon nitride layer.

121. The method according to claim 113, wherein the blocking layer is a silicon dioxide layer.

122. The method according to claim 113, wherein said metal layer is iridium.

123. The method according to claim 113, wherein said metal layer is platinum.

124. The method according to claim 113, wherein said metal layer is palladium.

125. The method according to claim 113, wherein said metal layer is osmium.

126. The method according to claim 113, wherein said metal layer is rhodium.

127. The method according to claim 113, wherein said metal layer is rhenium.

128. The method according to claim 113, wherein said metal layer is ruthenium.

129. The method according to claim 113, further comprising forming a reflecting layer over the infrared sensitive silicide layer.

130. The method according to claim 129, wherein said reflecting layer is selected from the group consisting of aluminum, tungsten, tungsten silicide, copper and platinum.

131. A method of forming a photodiode for use in an imaging device, said method comprising the steps of:
   forming a doped layer in a substrate;
   forming an insulating layer on said substrate;
   forming a trench in said insulating layer to said doped layer;
   forming a conductive layer on sidewalls and on the bottom of said trench;
   forming an infrared sensitive silicide layer with said conductive layer on at least a portion of said doped layer in said trench; and
   removing the conductive layer from an upper surface of said insulating layer.

132. The method according to claim 131, wherein the doped layer forming step further comprises ion implantation of at least one dopant into the substrate.

133. The method according to claim 131, wherein the doped layer is doped to a first conductivity type.

134. The method according to claim 133, wherein the first conductivity type is p-type.

135. The method according to claim 133, wherein the first conductivity type is n-type.

136. The method according to claim 131, wherein said infrared silicide layer is iridium silicide.

137. The method according to claim 131, wherein said infrared silicide layer is platinum silicide.

138. The method according to claim 131, wherein said infrared silicide layer is palladium silicide.

139. The method according to claim 131, wherein said infrared silicide layer is osmium silicide.

140. The method according to claim 131, wherein said infrared silicide layer is rhodium silicide.

141. The method according to claim 131, wherein said infrared silicide layer is rhenium silicide.

142. The method according to claim 131, wherein said infrared silicide layer is ruthenium silicide.

143. The method according to claim 131, further comprising forming a reflecting layer on the infrared sensitive silicide layer.

144. The method according to claim 143, wherein said reflecting layer is selected from the group consisting of aluminum, tungsten, tungsten silicide, copper and platinum.

145. The method according to claim 131, wherein said infrared silicide layer is removed by chemical-mechanical-polishing.

* * * * *